United States Patent
Parekhji et al.

(10) Patent No.: US 10,746,797 B1
(45) Date of Patent: Aug. 18, 2020

(54) DYNAMICALLY PROTECTIVE SCAN DATA CONTROL

(71) Applicant: Texas Instruments Incorporated, Dallas, TX (US)

(72) Inventors: Rubin Ajit Parekhji, Bangalore (IN); Mudasir Shafat Kawoosa, Srinagar (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/390,090

(22) Filed: Apr. 22, 2019

(51) Int. Cl.
  *G01R 31/3177* (2006.01)
  *G06F 11/263* (2006.01)
  *G01R 31/317* (2006.01)
  *G01R 31/3185* (2006.01)

(52) U.S. Cl.
  CPC ... *G01R 31/3177* (2013.01); *G01R 31/31725* (2013.01); *G01R 31/31727* (2013.01); *G01R 31/31853* (2013.01); *G01R 31/318536* (2013.01); *G01R 31/318552* (2013.01); *G01R 31/318555* (2013.01); *G06F 11/263* (2013.01)

(58) Field of Classification Search
  CPC .......... G01R 31/3177; G01R 31/31725; G01R 31/31853; G01R 31/318536; G01R 31/318555; G01R 31/318552; G01R 31/31727; G06F 11/263
  USPC .......................... 714/726, 727, 728, 729, 731
  See application file for complete search history.

(56) References Cited

U.S. PATENT DOCUMENTS

| | | | | |
|---|---|---|---|---|
| 6,573,703 | B1* | 6/2003 | Gyotoku | G01R 31/2879 324/750.05 |
| 7,134,061 | B2* | 11/2006 | Agashe | G01R 31/318552 714/726 |
| 7,653,849 | B1* | 1/2010 | Tabatabaei | G01R 31/318508 714/726 |
| 8,205,125 | B2 | 6/2012 | Hales et al. | |
| 8,856,601 | B2 | 10/2014 | Ravi et al. | |
| 8,914,689 | B2* | 12/2014 | Marinissen | G01R 31/318552 714/724 |
| 10,088,525 | B2* | 10/2018 | Kawoosa | G01R 31/2851 |
| 2001/0052096 | A1 | 12/2001 | Huijbregts | |
| 2003/0126533 | A1* | 7/2003 | McAdams | G01R 31/318536 714/727 |
| 2005/0278593 | A1* | 12/2005 | Muradali | G01R 31/318572 714/724 |
| 2007/0016834 | A1 | 1/2007 | Debnath et al. | |
| 2009/0125771 | A1* | 5/2009 | Duggal | G01R 31/318594 714/731 |

(Continued)

OTHER PUBLICATIONS

Hosseinabady et al., A Selective Trigger Scan Architecture for VLSI Testing, Mar. 2008, IEEE, vol. 57, No. 3, pp. 316-328. (Year: 2008).*

Primary Examiner — John J Tabone, Jr.
(74) Attorney, Agent, or Firm — Rose Alyssa Keagy; Charles A. Brill; Frank D. Cimino

(57) ABSTRACT

A method of testing a device under test, the device under test comprising a scan chain having a number of storage elements. The method determines a representation of toggling events in a test sequence, where the test sequence is for testing the scan chain. The method also selectively times input of a bit sequence, corresponding to the test sequence, to a first storage element in the number of storage elements, and through the scan chain, in response to the determining step.

21 Claims, 5 Drawing Sheets

(56) References Cited

U.S. PATENT DOCUMENTS

| | | | |
|---|---|---|---|
| 2012/0047412 A1* | 2/2012 | Chung | G06F 30/398 |
| | | | 714/731 |
| 2013/0159800 A1* | 6/2013 | Ravi | G01R 31/318547 |
| | | | 714/727 |
| 2017/0234925 A1* | 8/2017 | Kawoosa | G01R 31/31723 |
| | | | 714/727 |

* cited by examiner

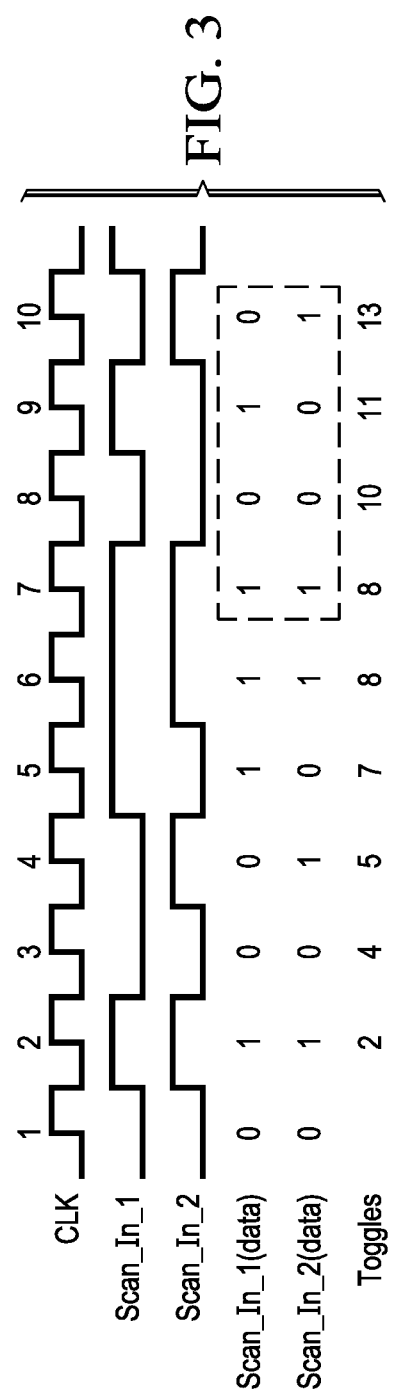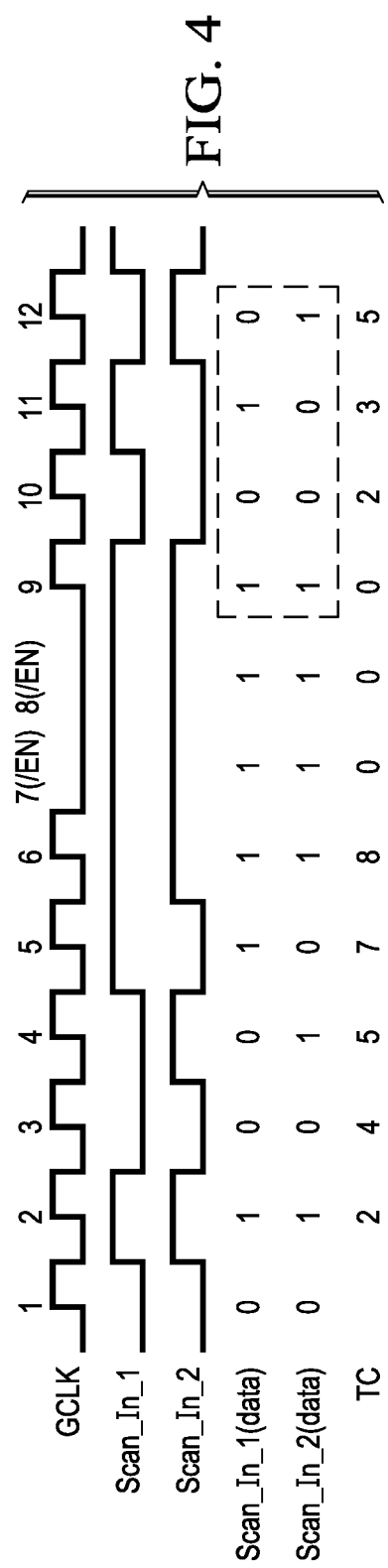

DYNAMICALLY PROTECTIVE SCAN DATA CONTROL

BACKGROUND

The example embodiments relate to scan chain control for testing electronic circuits.

Scan chains are typically included in various electronic circuits for testing manufacturing defects. Such electronic circuits include various integrated circuits, such as system-on-chip (SoC) circuits that generally provide a single integrated circuit with all required circuitry to perform a desired set of functions. A scan chain is generally a set of added circuitry that includes and operates generally in three operations: (i) sequentially scanning a known data sequence of 0 and 1 values into a series-connected set, or "chain", of circuit flip flops; (ii) applying that test data sequence to logic circuitry connected to outputs from the flip flop chain; and (iii) returning the logic circuitry output to the flip flop chain and scanning out the captured result, so as to compare it with an expected result. If the output matches the expected result, proper circuitry operation is thereby confirmed; conversely, if there is a mismatch, a potential fault may be thereby detected. Typically, scan testing is conducted via automated test equipment (ATE) that is programmed with test patterns, so that numerous different sequences may be loaded and compared against respective expected results. Failure comparisons may identify faults within the circuit, for purposes of evaluating device yield and also prohibiting unreliable devices from being released to the market.

Power consumption during scan chain testing is a factor for consideration. The number of flip flops in a scan chain, the number of modules of the device under test (DUT), and the frequency of the shifting through the chains all contribute to such power consumption. Further, the DUT will have a specified functional power limit for its normal (non-testing) operation. Accordingly, total or peak power consumption during scan testing cannot, or should not, exceed the functional power limit. Some earlier methods seek to limit test power consumption by selectively enabling/disabling different scan chains and/or different portions of the DUT during scan testing. Such methods impose static schedules on the scan shift operation. Additionally, such static techniques are typically fairly conservative, thereby avoiding excessive power consumption, but necessarily reducing scan data bandwidth and increasing the time required to test the DUT. While the test time increase due to slow scan shift frequency may not be significant for one module in the DUT, it would not be insignificant for today's complex SOCs which have several such modules (often in excess of 20). Other methods include additional circuitry to gate, or block, an output of a flip flop in a chain from continuing to the input of the combinational logic, so as to prevent any toggling (change of output state). This approach increases area consumed by the circuit on account of the additional gating circuitry and also imposes timing delays during functional mode. Another approach requires special adherence by each test sequence as part of the automatic test pattern generation (ATPG) process, whereby each test pattern is acceptable only if it does not cause a certain allowable maximum amount of toggling in the chain to be exceeded. This approach can result in excessive numbers of necessary test patterns (and the time expenditure to apply such patterns) or the ATPG tool may not be able to adhere to such conditions.

Accordingly, example embodiments are provided in this document that may improve on certain of the above concepts, as further detailed below.

SUMMARY

A method of testing a device under test, the device under test comprising a scan chain having a number of storage elements. The method determines a representation of toggling events in a test sequence, where the test sequence is for testing the scan chain. The method also selectively times input of a bit sequence, corresponding to the test sequence, to a first storage element in the number of storage elements, and through the scan chain, in response to the determining step.

Other aspects are also disclosed and claimed.

BRIEF DESCRIPTION OF THE DRAWINGS

FIG. 3 is a timing and data diagram for an example of two partial scan in sequence (SIS) sets, Scan_in_1 and Scan_in_2.

FIG. 4 is the timing and data diagram of FIG. 3, as modified by the example embodiment method of FIG. 2 and as may be implemented in the system of FIG. 1.

DETAILED DESCRIPTION

Figure 1:
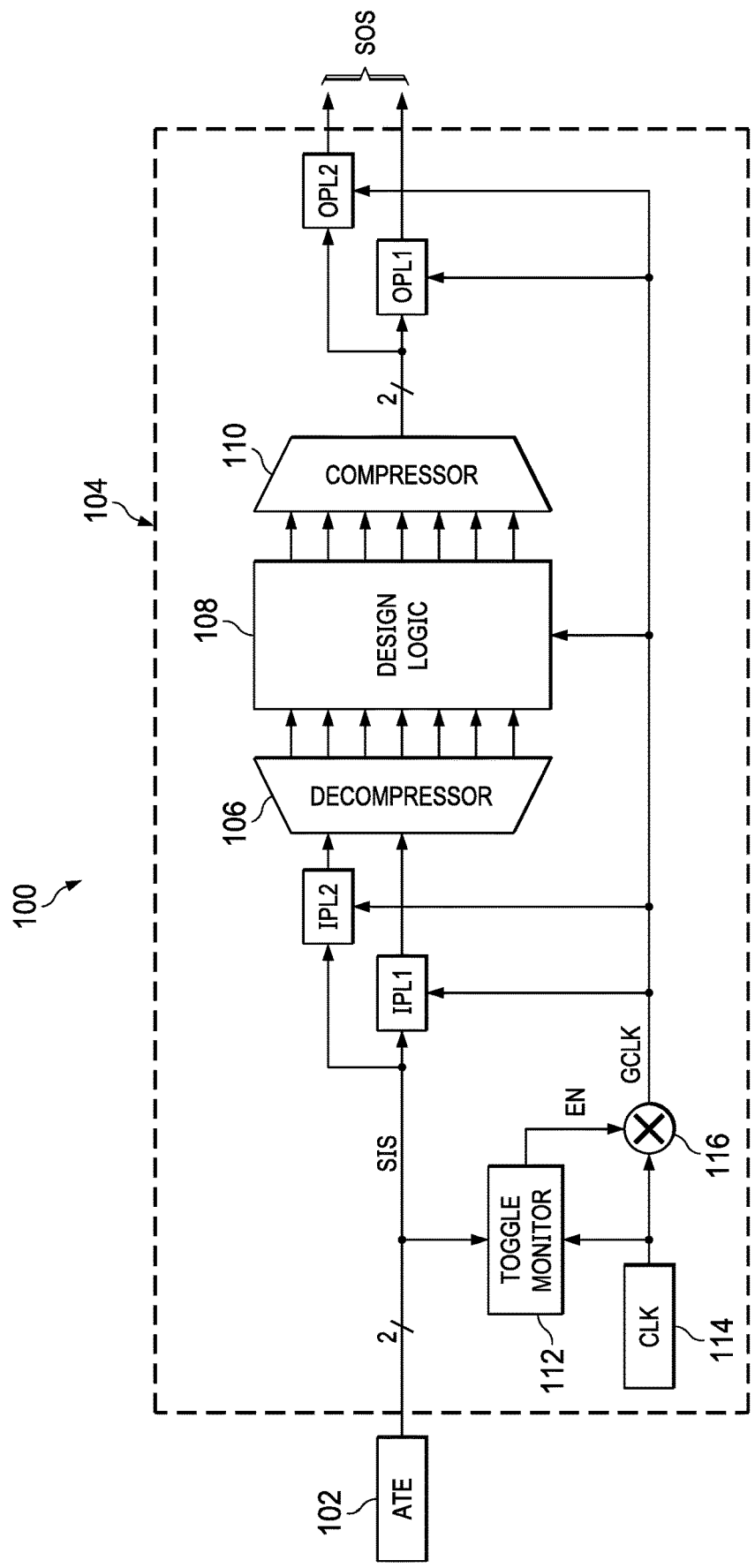
FIG. 1 is a schematic diagram of an example embodiment scan chain system.

FIG. 1 is a schematic diagram of an example embodiment scan chain system 100. System 100 includes automated test equipment (ATE) 102 connected to a device under test (DUT) 104, which may be one of various different forms of electronic circuits. ATE 102 is known in the art, and may be programmed by separate vendor tools with, or may itself create, automatic test pattern generation (ATG) and/or create various scan in sequence (SIS) data. The SIS data are typically incorporated into a test description language (TDL) that is used to evaluate DUT 104. The SIS data are a series of binary 0 and 1 values to be scanned in to one or more scan chains in DUT 104. In the example shown, two SIS sets are provided by ATE 102 at a time to DUT 104, with one SIS set connected to a data input of a single stage input pipeline IPL1, and another SIS set connected to data input of single stage input pipeline IPL2, where pipelining (e.g., via flip flops) of one or more stages may optionally be used to synchronize and account for delays of scan data as it is provided by ATE 102 to DUT 104. As will be understood by one skilled in the art from the teachings herein, alternative example embodiments may include, and operate in response to, either a single SIS set, or to a plurality of such sets, where the plurality has more than two sets of data, as shown in more detail later. As well known in the art, each scan chain in DUT 104 is a number of series connected, multiplexedinput, storage devices (e.g., flip flops), that is, starting with the first flip flop in the chain, the Q output of one flip flop is connected to the D/SD input of a next successive flip flop in the chain. Further, the final flip flop in the chain provides the data output for the chain, whereby each flip flop in the chain may be concurrently clocked so that data shifts along and out of the chain, akin to a shift register.

In more contemporary devices, and as also known and shown in the example of system 100, scan data are coupled to a decompressor 106, which outputs the scan data to scan chain flip flops in a design logic block 108, which outputs to a compressor 110 (sometimes also referred to as a compactor). Decompressor 106 provides selective switching (controlled through multiplexers or XOR gates or flip-flop based state machines implementing linear feedback shift register based pseudo-random pattern generators) to various different scan chain flip flops connected to nodes of design logic block 108. Accordingly, scan data may be switchably provided to those different flip flops, and from there to nodes, in design logic block 108. Accordingly, at different times, different nodes within block 108 may receive scan (test) data from input pipelines IPL1 and IPL2, so as to provide inputs from those nodes to logic or other circuitry in block 108 and connected to the receiving nodes. In reverse fashion, compressor 110 switchably (controlled through multiplexers or XOR gates or flip-flop based state machines implementing multiple input shift register based compactors) selects data states at various flip flop outputs, as received from nodes in design logic block 108, for output. Accordingly, once circuitry within design logic block 108 is operated (e.g., clocked for a cycle), scan chain outputs connected to that circuitry may be selected by compressor 110, with the data at those nodes then input to (optional) respective output pipeline stages OPL1 and OPL2. Pipeline stages OPL1 and OPL2 may then be successively clocked so as to shift the entire captured data set of those flip flops through those pipelines and out their respective outputs, thereby providing respective scan out sequences (SOS).

Returning to ATE 102 in FIG. 1, its output SIS sets are also connected to an input of a toggle monitor 112. As detailed in the remainder of this document, toggle monitor 112 includes a toggle aggregator which provides a representation of toggle activity as it aggregates across one or more SIS sets and/or scan data otherwise toggles in system 100. In the example of FIG. 1, the aggregation of toggle activity is achieved by a toggle counter TC (not separately shown), that may be reset when desired, but also that is incremented when a value in an input sequence SIS changes, that is, when two successive values in an SIS set have complementary states. Other examples of toggle aggregators are described later, and are at alternative locations within system 100 where toggle activity may be detected. In the example of FIG. 1 and for implanting toggle monitor to include a toggle counter TC, toggle monitor 112 includes circuitry, such as edge detection circuitry, for detecting when the binary value in an SIS set changes, or "toggles," from 0 to 1 or from 1 to 0, and that circuitry advances (e.g., increments for an up counter, or decrements for a down counter) the toggle counter TC for each such detection. Further, toggle counter TC advances for each SIS set, so for the example shown of two sets, TC is incremented when there is a toggle in either SIS set. For synchronization, toggle monitor 112 is clocked by a system CLK 114, and as evident below other items in system 100 are also synchronized to the system CLK. Toggle monitor 112 provides a control signal EN to the control input of a gate 116. Gate 116 also receives the system CLK as an input, and when enabled by the control signal EN, passes the CLK signal to its output, which for sake of distinction is herein referred to as a gated clock signal GCLK, essentially synchronizing CLK and GCLK when EN is actively asserted (e.g., using EN as a high active signal to a logical AND with system CLK). The gated clock signal GCLK is used to clock various devices, including the pipelines IPL1, IPL2, OPL1, and OPL2, and also scan chain flips flops in design logic block 108. Thus when gate 116 is enabled so that GCLK is asserted, each of those clocked devices synchronously operates to process the respective data presented to them. Note in the example embodiment that toggle monitor 112 (and its toggle counter) is implemented inside DUT 104 and operates in response to system CLK 114. In test mode, system CLK 114 may be provided by ATE 102 or also can be optionally generated internally.

Figure 2:
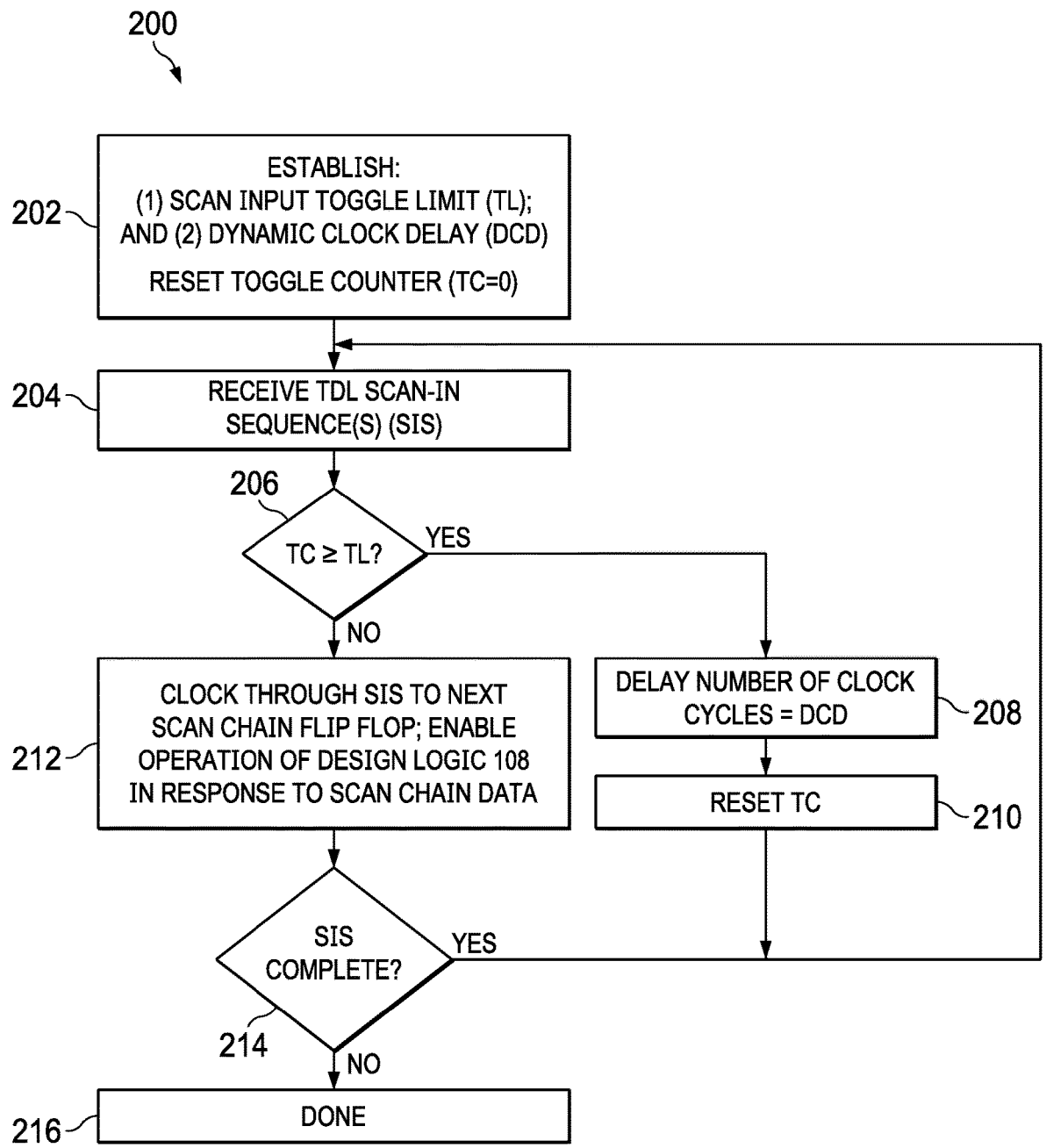
FIG. 2 is a flow chart of the operation of the system of FIG. 1.

FIG. 2 is a flow chart of a method 200 of operation of system 100 of FIG. 1. Method 200 may be implemented in various blocks of system 100, for example by including appropriate combinations of hardware and/or software in toggle monitor 112 and ATE 102, as may be ascertained by one skilled in the art given the present teachings. Method 200 commences with a step 202, such as at the beginning of a scan or from a reset. In step 202, two values are established for use in method 200. A first value is a scan input toggle limit TL which, as detailed below, establishes a maximum toggle threshold, such as maximum number of permissible toggles for one or more SIS sets before a DUT-protective (e.g., power saving) action is taken. A second value is dynamic clock delay DCD which, as detailed below, in response to dynamic detection of scan in sequence toggling, establishes a number of clock cycles over which the power saving action is taken. Lastly, step 202 resets (or initializes) the above-introduced toggle counter TC, for example setting it to zero, so that from its reset value TC may be advanced as each data toggle is detected in an SIS set. Next, method 200 continues from step 202 to step 204.

In step 204, one or more TDL SIS sets are received, one bit at a time, from ATE 102, such that a first bit in the sequence is input to the first flip flop in a respective input pipeline IPLx, or a subsequent bit after the first bit is received and input to that pipeline IPLx, while all bits for the sequence that preceded the subsequent bit are clocked one stage through a corresponding pipeline IPLx and then also through decompressor 106 from that pipeline IPLx to a scan chain flip flop in design logic 108. As introduced in the earlier example, a first SIS set is connected as an input to a first input pipeline IPL1 from where it may proceed to a scan chain in design logic 108, and a second SIS set is connected as an input to a second input pipeline IPL2 from where it may proceed to a different scan chain in design logic 108. At this point, however, note that without toggle monitor 112 asserting active the enable signal EN to gate 116, the pipelines IPL1 and IPL2 (and any scan chain to which an output of those pipelines may pass) are not yet clocked, so data connected to the inputs are not yet received into the pipelines. The same is true for later instances of step 204, involving successive data bits received in an SIS set, to be provided to the pipelines IPL1 and IPL2 (and for the scan chains that will receive data from those pipelines, via decompressor 106). Additionally, at the same time the SIS sets are connected to inputs of pipelines IPL1 and IPL2, they also are connected to toggle monitor 112, for detection of any toggling between successive bits in each SIS set. As noted earlier, if toggle monitor 112 detects a toggle (or multiple toggles), then toggle counter TC is advanced (e.g., incremented), accordingly. Next, method 200 continues from step 204 to step 206.

In step 206, a condition check of a comparison is made between the toggle count TC and the toggle limit TL. Note that a comparison, by definition, can be one of various options (e.g., equal, less than, etc.). As one example, step 206 shows the instance of whether the toggle count TC equals or exceeds the toggle limit TL. As introduced above and shown below by various examples, an example embodiment endeavors to protectively take a power savings action if the step 206 condition is met, so here that action is dynamically taken if the toggle count TC reaches or exceeds the toggle limit TL. Thus, TL is established in step 202 with this protective action anticipated (or so as to cause it to occur when desired), as triggered by the maximum number of acceptable toggles, as indicated by TL. Specifically, if TC reaches or exceeds TL, thereby indicating a number of toggles (TC) reaching or exceeding the threshold limit of TL, then method 200 continues from step 206 to steps 208 and 210. Otherwise, that is if TC is below TL, then method 200 proceeds from step 206 to step 212. Each of these alternative possibilities is discussed below.

In step 208, having been reached because TC equals or exceeds TL, then step 208 delays further GCLK clocking by the number DCD established in step 202. And, with respect to system 100, step 210 may be achieved by toggle monitor 112 de-asserting the EN signal to gate 116, so that the system CLK is not passed to the gated GCLK or, in other words, so the GCLK is blocked from transitioning, for DCD of the asserted CLK cycles. For example, if DCD=2, then for two full periods of the system CLK, the gated GCLK remains at its current state; during this dynamically-imposed delay, therefore, there is no asserted GCLK transition provided to DUT 104, and as a result neither the pipelines IPL1, IPL2, OPL1, and OPL2, nor the design logic 108 (including scan chains within it), is clocked—accordingly, the scan chain sequencing, and any operation of design logic block 108 in response to data in the scan chain, is temporarily suspended for DCD cycles of CLK. This protection allows the DUT power load to reduce to a desirable (e.g., negligible, zero) level. Following step 208, method 200 continues to step 210, which resets the toggle count TC, for example by setting it to zero, and then method 200 returns to step 204, whereupon the above process repeats, with the further possibility of continuing through step 206 to step 216, as further detailed below.

In step 212, having been reached because TC is less than the limit TL, then step 212 clocks each SIS through to each next respective scan chain flip flop, and step 212 also permits operation of design logic 108 in response to the scan chain data. With respect to system 100, step 214 may be achieved by toggle monitor 112 asserting the EN active to gate 116, so that the system CLK is passed as the gate GCLK, thereby causing GCLK to transition concurrently with CLK. As a result, all of the pipelines IPL1, IPL2, OPL1, and OPL2, and the design logic 108 (and scan chains within it), are clocked, so as to facilitate typical scan chain data advancement and logic circuit testing. Next, method 200 continues from step 212 to step 214.

In step 214, a check is performed as to whether the testing for the current set(s) SIS is complete. For example, such testing would be complete if all data bits of the SIS set(s) have been scanned into the scan chain(s), testing performed on the data bits and output back to the chains. Once such actions are complete, method 200 may continue from step 214 to step 216, so as to complete the scanning operation, for example, by scanning out the resultant chain data as output SOS in system 100.

To the contrary, if in step 214 the SIS set(s) has not been fully entered into the scan chain(s), then method 200 returns from step 214 to step 204. Thus, method 200 will repeat the sequence from step 204 through 214, until the entire SIS set(s) has passed into a respective scan chain, followed by step 216 completing any additional scan chain operations, such as outputting the scan output SOS.

Given the protective action taken in steps 208 and 210, example embodiments contemplate that TL can be programmed at the start of the application for a given TDL SIS pattern sub-set. For example, if a first number of patterns in the complete pattern set are more noisy (e.g., running off a higher frequency clock), TL can be programmed to a lower value. Corresponding to the DCD value, the actual scan pattern in ATE 102 should be padded with null cycles, so that during the DCD delayed clock cycles, there is no toggling of the scan input lines, that is, there is no new scan data being sent from ATE 102 to DUT 104.

FIG. 3 is an example timing and data diagram, including the system CLK in the top row, and two partial SIS sets, shown as signals in the second and third rows, respectively, as Scan_in_1 and Scan_in_2. The fourth and fifth rows show the binary values of Scan_in_1 and Scan_in_2, for later comparison to the operation of an example embodiment. Given FIG. 3, Scan_in_1 provides a sequence of 0100111010 and Scan_in_2 provides a sequence of 0101011001. With those sequences, FIG. 3 in its last row shows the cumulative toggling for Scan_in_1 and Scan_in_2. Thus, during system CLK period 1, both Scan_in_1 and Scan_in_2 are 0. In CLK period 2, both Scan_in_1 and Scan_in_2 toggle, that is, each transitions to a complementary state from the immediately-preceding CLK period 1, in that each transitions from 0 to 1. Thus, as shown in the FIG. 3 bottom row (e.g., as sensed just after the beginning of the low period of the CLK, here in period 2), a total of 2 toggles have cumulatively occurred for the plural SIS sets. Similarly, in CLK period 3 (at or near the beginning of its low period), both Scan_in_1 and Scan_in_2 toggle, here by transitions from 1 to 0. Thus, as shown in the FIG. 3 bottom row, as of CLK period 3, a total of 4 toggles have cumulatively occurred, with 2 toggles in the transition from CLK period 1 to CLK period 2, and an additional 2 toggles in the transition from CLK period 2 to CLK period 3. As one final example, in the transition from CLK period 3 to CLK period 4, only Scan_In_2 transitions from 0 to 1, while Scan_In_1 remains at a value of 0. With the additional single toggle in this CLK period 3 to CLK period 4, the toggle total increments to 5, as shown in CLK period 4, which follows the downward transition of CLK in clock cycle 3. The remaining accumulating toggle values should be evident to one skilled in the art. Given the transitions and toggling of FIG. 3, were those signals applied in general to a DUT, the increasing effects of the cumulating toggling could raise power consumption beyond a desirable level. In contrast, however, example embodiments avoid such excessive power consumption, as further detailed below.

FIG. 4 is the timing and data diagram of FIG. 3, as modified by the example embodiment method 200 of FIG. 2 and as may be implemented in system 100 of FIG. 1. The row ordering of FIG. 4 is the same as in FIG. 3, although the FIG. 4 illustration of an example embodiment, the gated GCLK is shown as opposed to the clock CLK of FIG. 3, while the same example SIS sets are presented (Scan_in_1 sequence=0100111010 and Scan_in_2 sequence=0101011001). As now explored, therefore, method 200 adds a delay of DCD (e.g., DCD=2) clock cycles in the application of the SIS sets to the scan chains and logic of system 100, so as to reduce the accumulating power consumed during testing. In more detail, FIG. 4 shows the same progression as FIG. 3 through the first six clock cycles, in which case a total of 8 toggles are detected, so in terms of FIGS. 1 and 2, toggle monitor 112 asserts EN active to gate 116 which passes CLK through as GCLK, through completion of clock cycle 6; also by that time, a total of 8 toggles have occurred for the two SIS sets, as accumulated in counter TC. In FIG. 4, however, assume that the toggle limit TL (see FIG. 2, step 206) is also 8; accordingly, after clock cycle 6, method 200 transitions to step 208, so as to delay the clock CLK by DCD cycles, and assume in this example that DCD=2 cycles. As a result, and as shown in FIG. 4, the gated clock GLCK is disabled (EN is disabled, shown as/EN in the FIG.) during clock cycles 7 and 8. Further, in addition to the step 208 clock delay, step 210 resets the toggle count TC to zero, as also shown in clock cycles 7 and 8, and control then returns to step 204 to resume the receipt of the SIS sets. Accordingly, for the next successive clock cycle 9, the SIS sets are received, but now step 206 determines that the reset TC (currently equal to 0) is below the threshold of TL (TL=8 in this example), so method 200 continues to step 212 and the system CLK is passed by gate 116 as the gated clock signal GLCK, which is shown restored active again during clock cycle 9. As a result, the SIS values in clock cycle 9 of FIG. 4 match the SIS values in clock cycle 7 of FIG. 3, as shown by a dashed box in both FIGS. 3 and 4. Moreover, one skilled in the art will appreciate that as long as TC does not again reach TL, as is the case for the remaining cycles in FIG. 4, then the same SIS values from FIG. 3 resume and continue in FIG. 4, for the remaining illustrated clock cycles. Hence, the dashed box of four data bits per SIS set in FIG. 3 and during clock cycles 7 through 10 in FIG. 3 are delayed in FIG. 4, by DCD=2 clock cycles, so that those same data bits are shown in FIG. 4 during clock cycles 9 through 12. Accordingly, the same SIS sets of FIG. 3 can be used in FIG. 4, with the reduction in the effect of excessive toggling by including a DCD=2 clock cycle delay, for example to reduce power consumption during that time.

Figure 5:
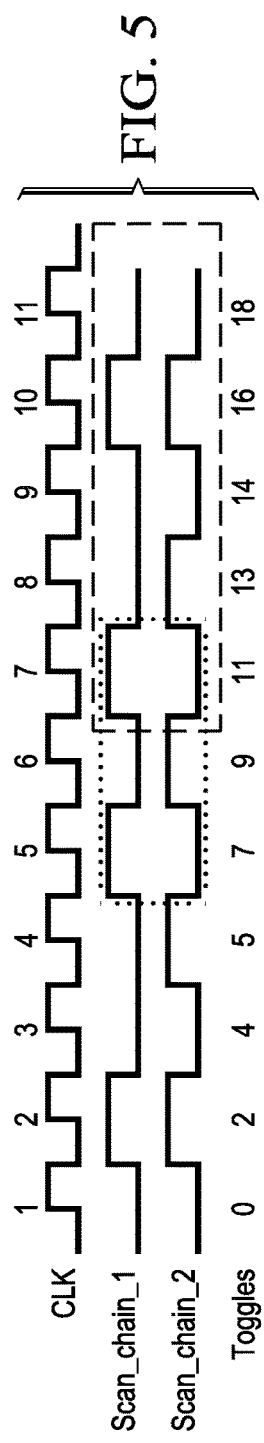
FIG. 5 is a timing diagram of two additional SIS sets that may be used in the system of FIG. 1.

FIG. 5 is a timing diagram of two additional SIS sets that may be used in system 100, again shown respectively, as Scan_in_1 and Scan_in_2, with FIG. 5 simplified to show 11 cycles of system CLK. In Scan_in_1, a total of 8 toggles occur (at the beginning of CLK cycles 2, 3, 5, 6, 7, 8, 10, and 11), while in Scan_in_2, a total of 10 toggles occur (at the beginning of each of CLK cycles 2-11). Given the preceding teachings, one skilled in the art should appreciate that were the FIG. 5 SIS sets applied in a typical scan chain system, a total of 18 toggles would be imposed on the system over a period of 10 clock cycles. Again, the imposition of such power-intensive activity may be undesirable.

Figure 6:
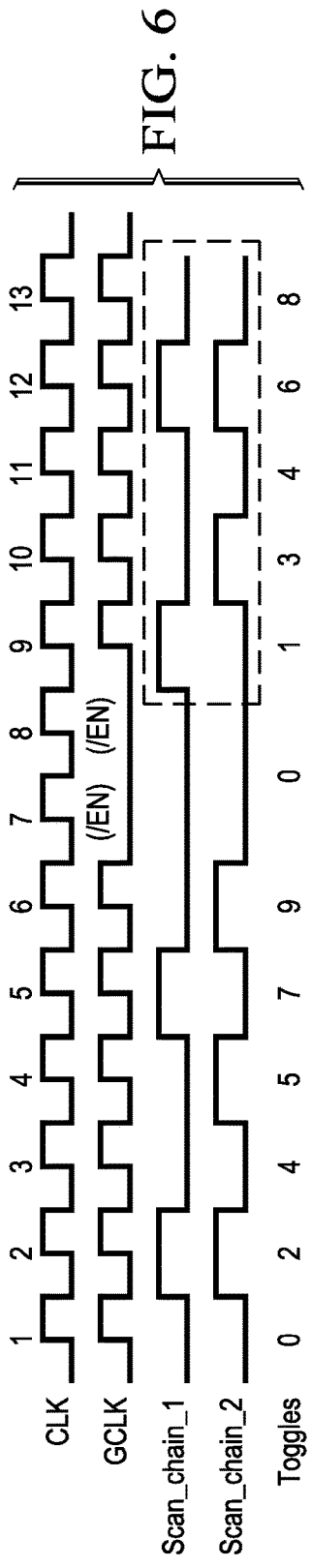
FIG. 6 is a timing diagram of the two SIS sets of FIG. 5, with timing modified according to example embodiments, such as by the FIG. 2 method as achieved by the FIG. 1 system 100, with an example toggle limit of 8 and a dynamic clock delay of 2.

FIG. 6 is a timing diagram of the two SIS sets of FIG. 5, with timing modified according to example embodiments, such as by method 200 as achieved by system 100, where by way of example TL=8 and DCD=2 (see FIG. 2, step 202). Through clock cycle 5, a total of 7 toggles occur, so method 200 continues to return to step 204 to receive successive bits in the SIS sets and apply them to what are shown as Scan_chain_1 and Scan_chain_2, which could be chains located in various parts of DUT 104 and monitored as described above. For clock cycle 6, however, an additional two toggles causes TC, the count of those toggles, to reach 9, thereby exceeding the limit of TL=8. Accordingly, the clock cycle 6 bits are applied as the system CLK completes the clock cycle, but then step 208 imposes a dynamic delay of DCD=2 clock CLK cycles, whereby gated clock GLCK does not transition for 2 system CLK cycles. After the delay, TC is reset (FIG. 2, step 210) and the SIS sets are again applied in system 100 to DUT 104. Starting at CLK period 9, therefore, the same SIS data is applied in FIG. 6, as shown DCD=2 clock cycles earlier in FIG. 5, again as shown in both figures by dashed boxes. For the remainder of FIG. 6, such data continues, as the value of TL is not again met or exceeded for the remainder of that data. Also given the preceding, the total number of clock cycles to fully apply the SIS data may be stated in terms as shown in the following Equation 1:

$$TCC = SISB + NI*DCD \qquad \text{Equation 1}$$

where,

SISB=SIS sequence number of bits
TCC=total clock cycles
NI=number of interrupts (when TL is reached or exceeded)
DCD=as defined earlier, number of clock cycles over with the power saving action is taken.

Applying Equation 1 to the example of FIG. 5 yields the result shown in FIG. 6 as depicted through the following Equation 1.1:

$$TCC = 11 + 1*2 = 13 \qquad \text{Equation 1.1}$$

Equation 1.1, therefore, demonstrates that system 100 can clock the entire SIS data over 13 clock CLK cycles, whereas, were it applied to a prior art system (if the SIS data were acceptable to such a system), 11 cycles may have been used. Thus, the example embodiments can use the same test data at a cost of only two additional clock cycles, while also providing favorable additional power load protection.

Figure 7:
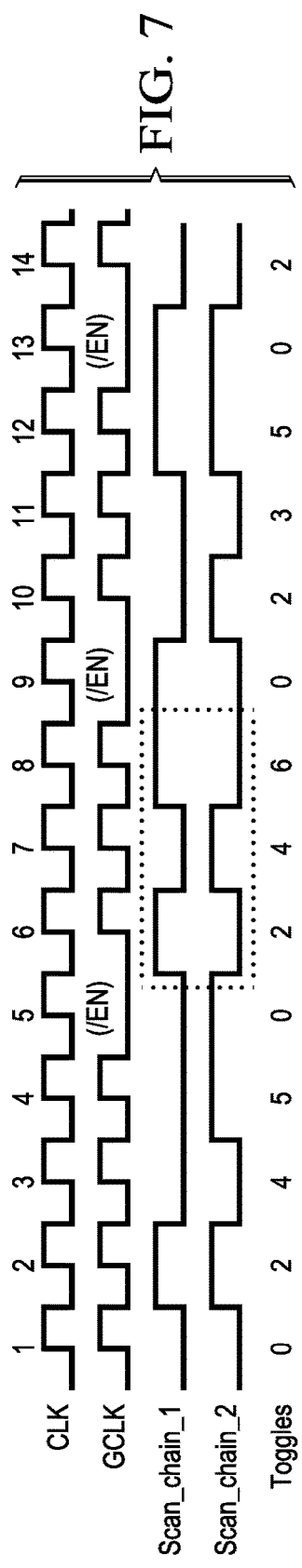
FIG. 7 is a timing diagram of the two SIS sets of FIG. 5, with timing modified according to example embodiments, such as by the FIG. 2 method as achieved by the FIG. 1 system 100, with an example toggle limit of 5 and a dynamic clock delay of 1.

FIG. 7 is a timing diagram of the two SIS sets of FIG. 5, but in FIG. 7 by way of example TL=5 and DCD=1. Through clock cycle 3, a total of 4 toggles occur, so method 200 continues to return to step 204 to receive successive bits in the SIS sets and apply them to input pipelines IPL1 and IPL2. For clock cycle 4, however, one additional toggle (e.g., near the beginning of clock cycle 4) causes TC to reach 5, thereby meeting the limit of TL=5. Accordingly, the clock cycle 4 data is applied, and then step 208 imposes a dynamic delay of DCD=1 clock CLK cycle, whereby the gated GLCK does not cycle during the system CLK cycle 5. Nonetheless, the system CLK continues to cycle, so there is a period of one system CLK cycle that occurs during the delay. After the delay, TC is reset (FIG. 2, step 210) and the SIS sets continue to be applied and clocked into DUT 104 (pipelines, scan chains, and logic). Starting at CLK period 6, therefore, the same SIS data is applied in FIG. 7, as shown DCD=1 clock cycle earlier in FIG. 5 (here, as shown in both figures by dotted boxes). Continuing in FIG. 7 from CLK period 6, the data continues, but note that by system CLK cycle 8, a total of 6 toggles are detected, since the reset occurred following clock cycle 4; accordingly, system CLK cycle 8 causes TL to be exceeded (TC=6>TL=5). Further, the system CLK cycle 8 data is applied to input pipelines IPL1 and IPL2, and then the method returns to step 208, which for this sequence imposes a dynamic delay of DCD=1 system CLK cycle, whereby the gated GLCK does not cycle during the CLK cycle 9. Again, clock CLK continues to cycle, so there is a second period of 1 CLK cycle that occurs during the delay (in addition to the delay from CLK cycle 4). After the delay of system CLK cycle 9, TC is reset and once more the SIS sets are clocked into DUT 104. By system clock CLK cycle 12, however, once again a total of TC=5 toggles are detected since the previous reset, so once more the above process repeats, with a DCD=1 clock cycle delay during system CLK cycle 13. Thereafter, TC is reset, and the remaining data is applied in system CLK cycle 14. Given this example, therefore, Equation 1 yields the result shown in the following Equation 1.2:

TCC=11+3*1=14     Equation 1.2

Equation 1.2, therefore, demonstrates that system 100 can clock the entire SIS data over 14 clock CLK cycles, only 4 cycles more than would a prior art system (again, if the SIS data were acceptable to such a system), using 11 cycles, but with the example embodiment again providing protection, here over multiple delays, to the DUT during the scan testing.

Figure 8:
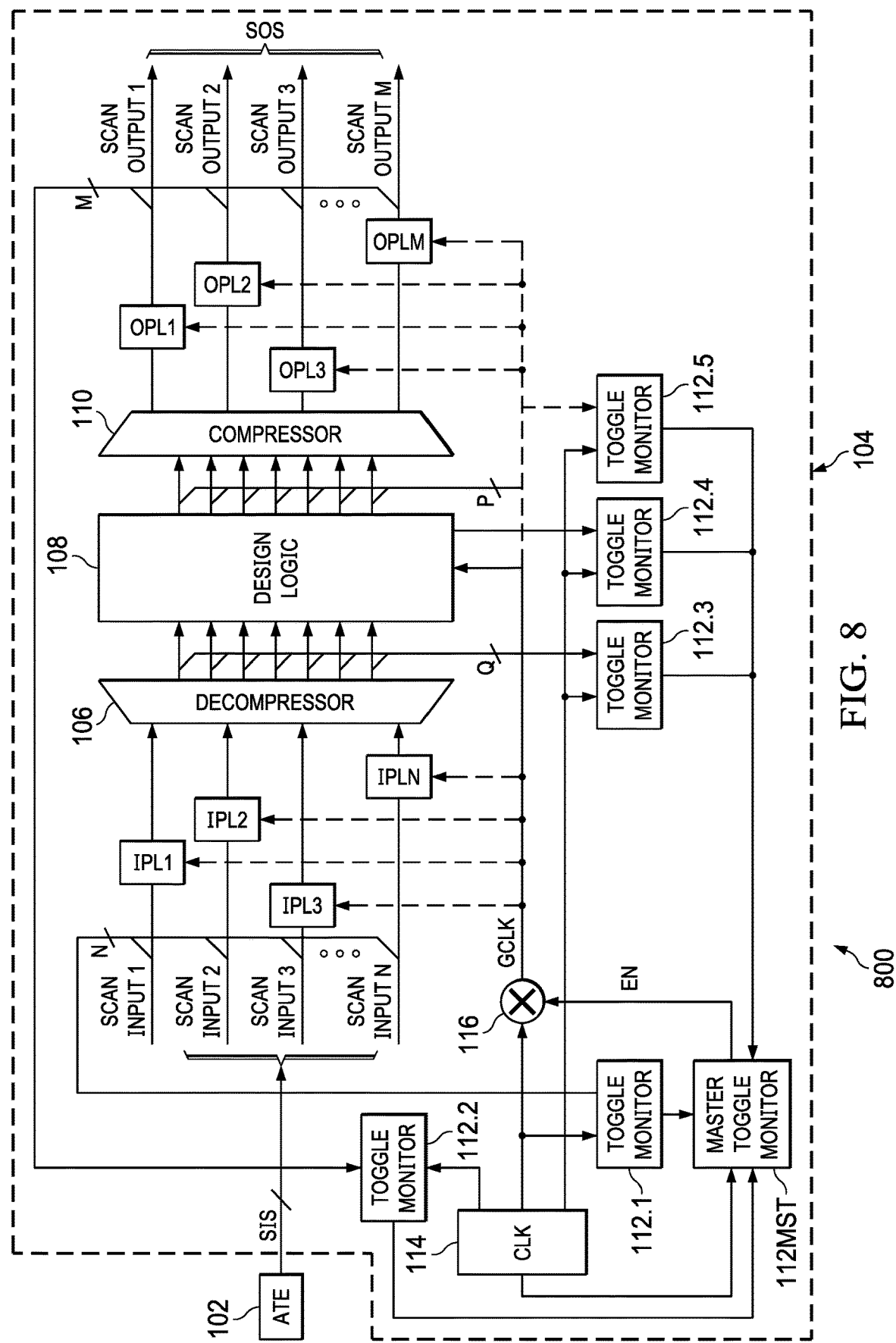
FIG. 8 is a schematic diagram to demonstrate various alternative example embodiments.

FIG. 8 is a schematic diagram to demonstrate various alternative example embodiments, illustrated generally as scan chain system 800. System 800 may include several of the same or comparable items of system 100 of FIG. 1, so common reference numbers are used for like items. As introduction, system 800 may include one or more toggle monitors 112.1 through 112.5, where the toggle monitor(s) detects toggling in scan data at a corresponding location within system 800 to which the toggle monitor(s) is connected. Further, a master toggle monitor 112MST may be included for accumulating information from other toggle monitors distributed within system 800, such that master toggle monitor 112MST can control operational flow per method 200, that is, detecting if toggle activity exceeds the toggle limit TL and delays further GCLK clocking by DCD cycles, for example by de-asserting the EN signal during those cycles. Lastly, system 800 provides for an integer N scan inputs and an integer M scan outputs.

Looking in more detail at certain of the system 800 toggle monitors, the N SIS sets, as provided by ATE 102 to respective single/multiple stages of optional input pipelines IPL1 through IPLN, are also connected as inputs to toggle monitor 112.1, which is clocked by the system CLK. Toggle monitor 112.1 may control operations according to method 200 of FIG. 2, or as shown in system 800 provides an output to master toggle monitor 112MST, so the latter can control operations in response to one or more toggle monitors. For example, a toggle monitor 112.2 also provides an output to master toggle monitor 112MST. Toggle monitor 112.2 is connected to receive the M SOS sets of data from compressor 110 as inputs, via respective single/multiple stages of output pipelines OPL1 through OPLM, and also is clocked by system CLK. In one example embodiment, therefore, toggle monitor 112.1 receives inputs of SIS sets, detects toggling activity in successive SIS bits, and reports a first representation of aggregate toggling to master toggle monitor 112MS, while concurrently toggle monitor 112.1 receives inputs of SOS sets, detects toggling activity in successive SOS bits, and reports a second representation of aggregate toggling to master toggle monitor 112MS. Further in this example embodiment, master toggle monitor 112MST aggregates the respective first and second aggregate toggling representation into a total representation. Thus, if each toggle monitor 112.x provides its representation as a digital count, then master toggle monitor 112MST adds those counts to provide a total digital count, representing a total number of detected toggles. This total number is used by master toggle monitor 112MST as the value TC in method 200. For example, consider a single system CLK cycle in which the N SIS values present 4 detected toggles, while concurrently the M SOS values present 3 detected toggles. Each of those toggle representations (totals) is output by respective toggle monitors 112.1 and 112.2 to master toggle monitor 112MST which aggregates the totals to a total count (TC) value of 7, and the TC values is compared, in step 206 (see FIG. 2), against the total limit TL, whereby a protective action (e.g., clock cycle delay) is taken if the limit is exceeded.

System 800 contemplates additional toggle monitors that may be implemented either in lieu of, or in addition to, one or both of toggle monitors 112.1 and 112.2. For example, the Q outputs (Q>>N) of decompressor 106 are connected as inputs to a toggle monitor 112.3, selected nodes from scan chains in design logic 108 are connected as inputs to a toggle monitor 112.4, and the P inputs (P=Q; P>>M) of compressor 110 are connected as inputs to a toggle 112.5. Further, while selected nodes from scan chains in design logic 108 are shown connected as inputs to a single toggle monitor 112.4, more than one toggle monitor may be implemented to different respective scan paths within design logic 108, based on design considerations that may indicate a need to separately evaluate such different paths. Different combinations of toggle monitors 112.1 through 112.5 may be implemented, or selected by master toggle monitor 112MST at different times, where master toggle monitor 112MST determines a final toggle activity from the individual toggle representations from each of the implemented/selected toggle monitors. Master toggle monitor 112MST uses the final toggle activity representation as a basis of comparison to toggle limit TL, with the result of controlling the EN signal to gate 116, so as to disable clocking of scan data for the DCD cycles when that final representation, for a clock cycle or as accumulated over multiple clock cycles, exceeds the toggle limit TL.

Where more than one toggle monitor is used, master toggle monitor 112MST may apply differing weighting to the respective toggle activity representations. For example, a first toggle monitor may detect and report a first toggle activity representation to master toggle monitor 112MST, for a first scan data set corresponding to a high voltage, high leakage circuit path, and a second toggle monitor may detect and report a second toggle activity representation to master toggle monitor 112MST, for a second data set corresponding to a low voltage, low leakage circuit path. In response, and in determining a final toggle activity representation, master toggle monitor 112MS may apply a first and higher weight to the first representation, as compared to a second and lower weight to the second representation. In this way, the step 206 comparison will be more sensitive to toggling activity for the high voltage, high leakage circuit path, thereby taking the protective action based more on that activity, as such activity is likely to have a greater power impact.

Toggle representations from any of the described toggle monitors (or as aggregated by master toggle monitor 112MST) have been shown by example as counts, but other representations are contemplated. In one instance, digital counts still may be used, but instead of aggregating counts for all lines on a bus, it can be implemented for a subset of lines, with an expectation that the subset is a reasonable approximate of toggling activity on other lines. In another instance, where a digital approach again is used, instead of a count a state machine could be implemented, by considering a truth table of the possible state transitions in a given cycle based on the number of sensed scan inputs, whereby a next state is provided that represents the total toggles occurring, and the next stage may be used to compare against a toggle limit per method 200. In yet another instance, rather than the digital domain, aggregates may be evaluated in the analog domain, using forms of a magnitude changing signal may be implemented in response to a number of detected toggles. Such forms may include, as examples, a voltage doubler, an incremental charge on a capacitance, or a charge pump, where in each example as more toggles are detected, an increasing analog voltage is provided. Indeed, where multiple toggle monitors are implemented, or where a toggle monitor is concurrently sensing multiple inputs per clock cycle, an analog approach may be desirable so as to avoid the need of complex digital counters, adders and the like. Further, master toggle monitor 112MST can respond to received toggle representations in manners other than accumulating all representations. As examples, master toggle monitor 112MST could maintain separate aggregates for each respective toggle monitor, and then compare the largest of those aggregates to a limit or compare each of those separate aggregates to respective limits, with those limits being either the same or being different, for example by having a limit set based on the expected activity monitored by a given toggle monitor. Lastly, with variations contemplated in the total toggling activity representation (whether a count TC of otherwise), also contemplated are variations in how the total is compared to a limit. Without loss of generality, it can be provided that TC and TL are compared not on actual values, but on threshold values.

From the above, one skilled in the art should appreciate that numerous example embodiments are provided, representing both a system and method with dynamically protective scan data control. Example embodiments have shown such control by monitoring SIS data toggling as such data is input to the DUT, and dynamically enabling DUT protection when such toggling is excessive, such as by temporarily delaying throughput of the scan chain data for a period(s) of time between the time the scanning of an SIS commenced and when it is finished. In an example embodiment, the monitoring is achieved by counting toggling during a time from a prior low power period (e.g., from reset or a prior protective event), and protection is dynamically implemented for the DUT if the toggle count meets or exceeds a threshold. In an example embodiment, protective action discontinues the clocking of the SIS data into the DUT, and preferably also discontinues clocking of the DUT logic circuitry, so that such circuitry also is idle during the protective period. Indeed, example embodiments can provide still other benefits. As examples:

(1) the beneficial protection across a single SIS pattern or across a set of two or more such patterns;

(2) with dynamic protection, patterns that may not have been included by ATE in the prior art, due to concerns with power consumption of such patterns, may be included and used with example embodiments;

(3) creation of SIS test patterns may be more inclusive than the prior art, thereby easing the pattern creation process and also more thoroughly testing the DUT and improving yield, while still protecting it during such testing;

(4) with the adjustable variables of TL and DCD, example embodiments provide a granular way of controlling toggle activity during scan shift operation;

(5) example embodiments are suitable even after silicon is available for the DUT, based upon weak lot/strong lot/different corners;

(6) example embodiments can be used for incremental debug after a given number of shift cycles;

(7) no margin padding is needed to protect against excessive scan shift frequency.

(8) example embodiments can reduce or eliminate overdesigning of the DUT as may be needed in the prior art to protect against scan damage;

(9) example embodiments have no quality of return (QOR) impact;

(10) there is no change in ATPG pattern set care-bit density for optimal pattern count and peak coverage attainment; and

(11) reduced testing time as against an entire pattern being run at a lower frequency.

Still further, additional modifications are possible in the described embodiments, and other embodiments are possible, within the scope of the following claims.

What is claimed is:

1. A method of testing a device under test, the device under test comprising a scan chain having a number of storage elements, the method comprising:
   determining a representation of toggling events in a test sequence, the test sequence for testing the scan chain; and
   selectively timing input of a bit sequence, corresponding to the test sequence, to a first storage element in the number of storage elements, and through the scan chain, in response to the determining step.

2. The method of claim 1 wherein the selectively timing step comprises selectively timing input of the bit sequence to the first storage element in the number of storage elements, and through the scan chain, in response to the representation of toggling events as compared to a threshold.

3. The method of claim 2 wherein the threshold is dynamically adjustable.

4. The method of claim 1 wherein the selectively timing step comprises selectively clocking the bit sequence to the first storage element and through the scan chain.

5. The method of claim 4 wherein the selectively clocking comprises:
   clocking the bit sequence into the first storage element in the number of storage elements, and through the scan chain, in response to a first comparison result of the representation of toggling events to a threshold; and
   delaying the clocking of the bit sequence into the first storage element in the number of storage elements, and through the scan chain, in response to a second comparison result of the representation of toggling events to the threshold.

6. The method of claim 5 wherein the delaying step comprises delaying the clocking for a number of clock cycles.

7. The method of claim 6 wherein the number of clock cycles is dynamically adjustable.

8. The method of claim 1 wherein the test sequence comprises a first test sequence in a plurality of test sequences and the device under test comprises a plurality of scan chains:
   wherein the determining step comprises determining a representation of toggling events cumulatively in the plurality of test sequences, each test sequence in the plurality of test sequences corresponding to a respective chain in the plurality of scan chains; and
   wherein the selectively timing step comprises selectively timing input of each test sequence of the plurality of test sequences to a respective scan chain in the plurality of scan chains, and through each of the respective scan chains, in response to the determining step.

9. The method of claim 1 wherein the determining step determines the number of toggling events in response to a change in state between successive bits in the test sequence.

10. The method of claim 1 wherein the determining step determines the representation as a number of toggling events.

11. The method of claim 1 wherein the determining step determines the representation as an analog signal that changes in magnitude in response to toggling events.

12. The method of claim 1 wherein the determining step determines the representation of toggling events in the test sequence as an input test sequence to be coupled to a first storage element in the number of storage elements.

13. The method of claim 1 wherein the determining step determines the representation of toggling events in the test sequence as an output test sequence to be received from a last storage element in the number of storage elements.

14. The method of claim 1 wherein the determining step determines the representation of toggling events in the test sequence as an output sequence between a decompressor and design logic of the device under test.

15. The method of claim 1 wherein the determining step determines the representation of toggling events in the test sequence as an output sequence between design logic and a compressor of the device under test.

16. The method of claim 1 wherein the determining step determines the representation of toggling events in the test sequence as a sequence in design logic of the device under test.

17. The method of claim 1 wherein the determining step determines the representation as a first representation of toggling events in a test sequence for testing a first location of the device under test, and further comprising determining a second representation of toggling events in a test sequence for testing a second location of the device under test.

18. The method of claim 17 wherein the selectively timing step is responsive to comparing the first representation to a first limit and the second representation to second limit.

19. The method of claim 17 wherein the selectively timing step is responsive to comparing an aggregate representation of the first representation and the second representation to limit.

20. The method of claim 17 wherein the selectively timing step is responsive to comparing a weighted aggregate representation of the first representation and the second representation to limit.

21. An electronic device that may be tested, the device comprising:
   a scan chain having a number of storage elements;
   detection circuitry configured to determine a representation of toggling events in a test sequence, the test sequence for testing the scan chain; and
   timing circuitry configured to selectively time input of a bit sequence, corresponding to the test sequence, to a first storage element in the number of storage elements, and through the scan chain, in response to the detection circuitry.

* * * * *